(12) United States Patent
Kwak et al.

(10) Patent No.: US 9,563,083 B2
(45) Date of Patent: Feb. 7, 2017

(54) DISPLAY DEVICE INCLUDING MAIN LIGHT BLOCKING PORTION AND SPACERS

(71) Applicant: Samsung Display Co., Ltd., Yongin (KR)

(72) Inventors: Chang Hun Kwak, Suwon-si (KR); Young Bong Cho, Seongnam-si (KR); Chul Huh, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/714,889

(22) Filed: May 18, 2015

(65) Prior Publication Data

US 2016/0178950 A1    Jun. 23, 2016

(30) Foreign Application Priority Data

Dec. 19, 2014    (KR) .................. 10-2014-0184624

(51) Int. Cl.

| | |
|---|---|
| *G02F 1/1339* | (2006.01) |
| *G02F 1/1368* | (2006.01) |
| *G02F 1/1335* | (2006.01) |
| *H01L 27/12* | (2006.01) |
| *H01L 29/786* | (2006.01) |

(52) U.S. Cl.
CPC ......... *G02F 1/13394* (2013.01); *G02F 1/1368* (2013.01); *G02F 1/133512* (2013.01); *G02F 1/133514* (2013.01); *G02F 1/133516* (2013.01); *H01L 27/1214* (2013.01); *H01L 27/1288* (2013.01); *H01L 29/78633* (2013.01); *G02F 2001/13396* (2013.01)

(58) Field of Classification Search
None
See application file for complete search history.

(56) References Cited

U.S. PATENT DOCUMENTS

| | | | |
|---|---|---|---|
| 2008/0068537 A1* | 3/2008 | Lee ................... | G02F 1/136209 349/106 |
| 2012/0038867 A1* | 2/2012 | Kwon ............... | G02F 1/133512 349/110 |
| 2013/0329155 A1 | 12/2013 | Kwak et al. | |

(Continued)

FOREIGN PATENT DOCUMENTS

| | | |
|---|---|---|
| CN | 103995380 | 8/2014 |
| EP | 2767865 | 8/2014 |

(Continued)

*Primary Examiner* — Bilkis Jahan
(74) *Attorney, Agent, or Firm* — Cantor Colburn LLP

(57) ABSTRACT

A display device includes a first substrate and a second substrate facing each other, a first thin film transistor ("TFT") disposed on the first substrate, a second TFT disposed on the first substrate, a first color filter disposed on the first TFT and a periphery thereof, a second color filter disposed on the second TFT and a periphery thereof and representing a different color from the first color filter, and a light blocking member disposed on the first and second color filters where the light blocking member includes a first spacer disposed on the first TFT and the first color filter, a second spacer disposed on the second TFT and the second color filter, a main light blocking portion disposed in peripheries of the first and second spacers, and a furrow disposed between the second spacer and the main light blocking portion.

11 Claims, 14 Drawing Sheets

(56) References Cited

U.S. PATENT DOCUMENTS

| | | |
|---|---|---|
| 2014/0049717 A1 | 2/2014 | Kwak et al. |
| 2014/0232970 A1 | 8/2014 | Huh et al. |
| 2015/0092138 A1* | 4/2015 | Kwak ............... G02F 1/133512 349/85 |

FOREIGN PATENT DOCUMENTS

| | | |
|---|---|---|
| JP | 2002229040 | 8/2002 |
| JP | 2012103474 | 5/2012 |
| JP | 2014157349 | 8/2014 |
| KR | 1020130062123 | 6/2013 |
| KR | 1020130137457 | 12/2013 |
| KR | 1020140023710 | 2/2014 |

\* cited by examiner

DISPLAY DEVICE INCLUDING MAIN LIGHT BLOCKING PORTION AND SPACERS

This application claims priority to Korean Patent Application No. 10-2014-0184624 filed on Dec. 19, 2014, and all the benefits accruing therefrom under 35 U.S.C. §119, the entire contents of which are incorporated herein by reference.

BACKGROUND (a) Field

The invention relates to a display device and a manufacturing method thereof, and more particularly, to a display device in which a light blocking member and thin film transistors are disposed on the same substrate, and a manufacturing method thereof.

(b) Description of the Related Art

A display device such as a liquid crystal display ("LCD"), an organic light emitting diode ("OLED") display, or the like generally includes a display panel including a plurality of pixels including switching elements and a plurality of signal lines, and a driving unit.

As one of the most widely used displays at present, the LCD includes at least one display panel formed with field generating electrodes and a liquid crystal layer.

The LCD may display a desired image by applying a voltage to the field generating electrodes, realigning liquid crystal molecules of the liquid crystal layer, and controlling an amount of transmitted light.

When the LCD includes two display panels, the field generating electrodes may be respectively provided in the two display panels facing each other, or the two field generating electrodes may be disposed in one display panel.

A pixel electrode of the field generating electrodes to which a data voltage is applied and a plurality of thin film transistors ("TFTs") may be arranged in a matrix form in one of the display panels facing each other, a color filter for representing primary colors such as red, green, and blue, for example, and a light blocking member for preventing light leakage between pixels may be formed in the other display panel.

However, in the liquid crystal display described above, since the pixel electrode, the TFTs, and the color filter or the light blocking member are formed in the different display panels, it is difficult to make an accurate alignment between the pixel electrode and the color filter or between the pixel electrode and the light blocking member, thereby causing an alignment error.

To solve the problem, a structure for forming the light blocking member in the same display panel as the pixel electrode and the TFT has been proposed, and in this case, the color filter may be formed in the same display panel as the pixel electrode.

As such, the light blocking member may be integrally formed in the display panel in which the pixel electrode and the TFT are formed, thereby achieving a high aperture ratio and high transmittance of the liquid crystal display.

When including the two display panels, the LCD may include a plurality of spacers for maintaining a cell gap between the two display panels.

The plurality of spacers includes a main spacer and a sub-spacer having a height lower than that of the main spacer.

When an external pressure is applied to the LCD to cause a change of the cell gap between the two display panels, the sub-spacer may serve to maintain the cell gap between the two display panels and to prevent deformation of the main spacer to an extent that does not allow it to be restored to its original shape.

SUMMARY

Color filters included in the liquid crystal display may include organic materials for representing various primary colors. The color filters may have different planarization characteristics according to kinds of primary colors. Thus, depending on the primary colors, heights of upper surfaces of the color filters may be changed according to planarization characteristics of lower parts of the different color filters.

When spacers are disposed on the color filters that have the different heights according to the different primary colors, differences in the heights of the spacers disposed in pixels for representing the different primary colors are great, and therefore a sub-spacer needs to be provided depending on the primary colors.

If masks having different transmittances are used for pixels having different heights of the upper surfaces of the different color filters to make the heights of the upper surface identical to each other, this not only makes manufacturing the masks difficult but also increases a manufacturing cost, thereby deteriorating product price competitiveness.

The invention has been made in an effort to easily form sub-spacers by similarly adjusting heights of the upper surfaces of the sub-spacers disposed in the pixels for representing the different colors substantially without increasing the manufacturing cost.

Further, the invention has been made in an effort to reduce smudges occurring due to external pressure by increasing an area ratio of the sub-spacer.

A display device according to an exemplary embodiment of the invention includes a first substrate and a second substrate facing each other, a first thin film transistor ("TFT") disposed on the first substrate, a second TFT disposed on the first substrate, a first color filter disposed on the first TFT and a periphery of the first TFT, a second color filter disposed on the second TFT and a periphery of the second TFT and representing a different color from that of the first color filter, and a light blocking member disposed on the first and second color filters. The light blocking member includes a first spacer disposed on the first TFT and the first color filter, a second spacer disposed on the second TFT and the second color filter, a main light blocking portion disposed in peripheries of the first and second spacers, and a furrow disposed between the second spacer and the main light blocking portion.

In an exemplary embodiment, a height from an upper surface of the main light blocking portion to an upper surface of the first and second spacers may be smaller than a distance from the upper surface of the main light blocking portion to a surface of the second substrate.

In an exemplary embodiment, the furrow may be disposed along an edge of the second spacer.

In an exemplary embodiment, the furrow may include a closed curve.

In an exemplary embodiment, the furrow may have a width of about 1 micrometer ($\mu$m) to about 2 $\mu$m.

In an exemplary embodiment, the furrow may have a depth of about 0.1 $\mu$m to about 0.3 $\mu$m from the upper surface of the main light blocking portion.

In an exemplary embodiment, the second color filter disposed on the second TFT may have a greater thickness than that of the first color filter disposed on the first TFT.

In an exemplary embodiment, the light blocking member may further include a third spacer that is disposed both on the periphery of the second TFT and on the second color filter and is connected to the main light blocking portion, and a height from the upper surface of the main light blocking portion to an upper surface of the third spacer may be smaller than a distance from the upper surface of the main light blocking portion to the surface of the second substrate.

In an exemplary embodiment, a thickness of the second color filter disposed on the second TFT may be greater than that of the first color filter disposed on the first TFT.

In an exemplary embodiment, the second color filter may represent green.

In an exemplary embodiment, a first pixel electrode disposed on the first color filter and a second pixel electrode disposed on the second color filter may be further included.

A manufacturing method of a display device according to an exemplary embodiment of the invention includes forming first and second TFTs on a substrate, forming a first color filter on the first TFT and a periphery of, the first TFT, forming a second color filter on the second TFT and a periphery of, the second TFT, and coating a light blocking material layer on the first and second color filters and exposing the light blocking material layer to light using a photomask. The photomask includes a first halftone region corresponding to the light blocking material layer disposed on the first TFT and the first color filter, a second halftone region corresponding to the light blocking material layer disposed on the second TFT and the second color filter, and an opaque region provided along an edge of the second halftone region, and light transmittance of the first halftone region is higher than that of the second halftone region while light transmittance of the opaque region is lower than that of the second halftone region.

In an exemplary embodiment, the photomask may further include a main region that is disposed in peripheries of the first halftone region and the opaque region and has a same light transmittance as that of the second halftone region.

In an exemplary embodiment, a width of the opaque region may be about 1 micrometer (μm) to about 2 μm.

In an exemplary embodiment, the opaque region may include a closed curve.

In an exemplary embodiment, the manufacturing method may further include forming a first spacer corresponding to the first halftone region by exposing the light blocking material layer to light using the photomask, and forming a second spacer corresponding to the second halftone region by exposing the light blocking material layer to light using the photomask.

In an exemplary embodiment, the manufacturing method may further include forming a main light blocking portion corresponding to the main region by exposing the light blocking material layer to light using the photomask, and forming a furrow corresponding to the opaque region and disposed between the second spacer and the main light blocking portion.

In an exemplary embodiment, a thickness of the second color filter disposed on the second TFT may be greater than that of the first color filter disposed on the first TFT.

In an exemplary embodiment, the manufacturing method may further include forming a third TFT on the substrate, forming a third color filter on the third TFT and a periphery of the third TFT, and coating the light blocking material layer on the third color filter and exposing the light blocking material layer to light using the photomask. The photomask may further include a transparent region corresponding to the light blocking material layer disposed on the third TFT and the third color filter, and light transmittance of the transparent region may be higher than that of the first halftone region.

In an exemplary embodiment, the manufacturing method may further include forming a third spacer corresponding to the transparent region by exposing the light blocking material layer to the light using the photomask.

According to the exemplary embodiment of the invention, heights of the upper surfaces of the sub-spacers disposed in the pixels for representing the different colors may be substantially similarly adjusted, thereby easily forming the sub-spacers without increasing the manufacturing cost.

In addition, the area ratio of the sub-spacer may be increased to reduce the smudges that may occur due to the external pressure.

BRIEF DESCRIPTION OF THE DRAWINGS

The above and other exemplary embodiments, advantages and features of this invention will become more apparent by describing in further detail exemplary embodiments thereof with reference to the accompanying drawings, in which.

DETAILED DESCRIPTION

Figure 1:
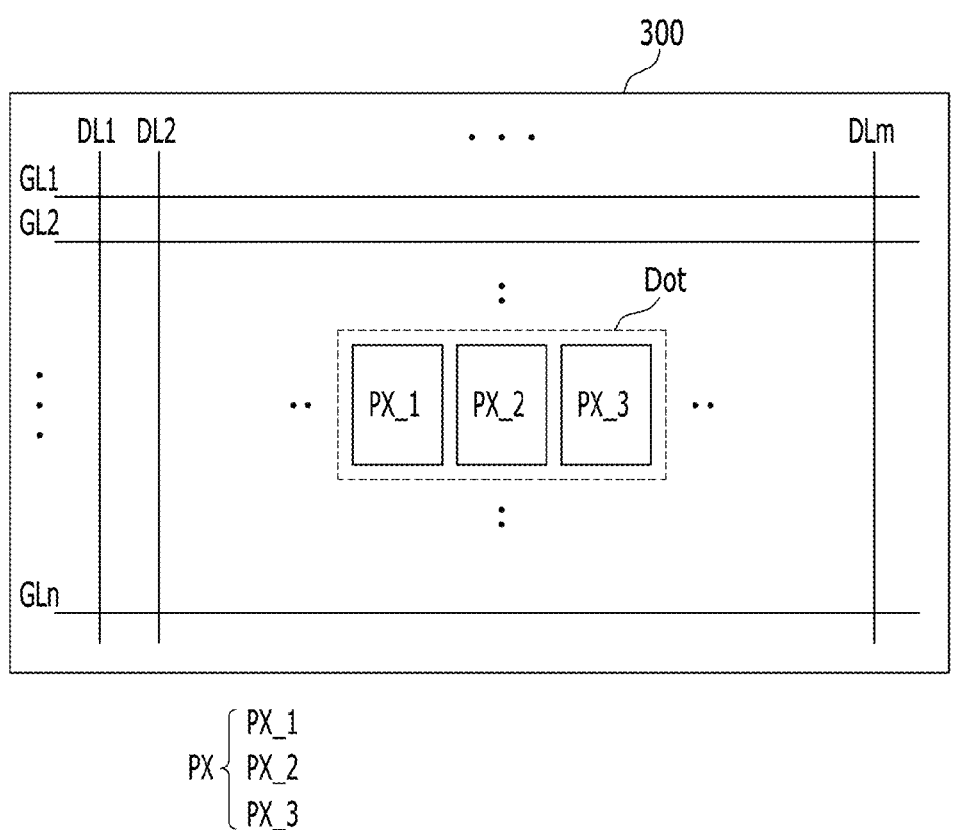
FIG. 1 is a schematic plan view of an exemplary embodiment of a display device according to the invention.

The invention will be described more fully hereinafter with reference to the accompanying drawings, in which exemplary embodiments of the invention are shown.

As those skilled in the art would realize, the described embodiments may be modified in various different ways, all without departing from the spirit or scope of the invention.

In the drawings, the thickness of layers, films, panels, regions, etc. are exaggerated for clarity.

Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

Parts that are irrelevant to the description will be omitted to clearly describe the invention, and the same or similar constituent elements will be designated by the same reference numerals throughout the specification.

Throughout this specification and the claims that follow, when it is described that an element is "coupled" to another element, the element may be "directly coupled" to the other element or "electrically coupled" to the other element through a third element.

Further, unless explicitly described to the contrary, the word "comprise" and variations such as "comprises" or "comprising" will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

A structure of a display device according to an exemplary embodiment of the invention will now be described with reference to FIGS. 1 and 2.

Referring to FIG. 1, the display device according to the exemplary embodiment of the invention includes a display panel 300, and the display panel 300 includes a plurality of signal lines and a plurality of pixels PX that are connected thereto and arranged in an approximate matrix form.

When the display device according to the exemplary embodiment of the invention is a liquid crystal display ("LCD"), the display panel 300 may include, when viewed in a cross-section, lower and upper panels facing each other (not shown) and a liquid crystal layer (not shown) interposed therebetween.

The signal lines include a plurality of gate lines GL1 to GLn for transmitting a gate signal, and a plurality of data lines DL1 to DLm for transmitting a data voltage.

One pixel PX may include at least one switching element Q connected to at least one data line DLj (j=1, 2, . . . , m) and at least one gate line GLi (i=1, 2, . . . , n), and at least one pixel electrode (not shown) connected thereto.

The switching element Q may include at least one thin film transistor ("TFT"), and may be controlled by the gate signal transmitted through the gate line GLi to transmit the data voltage transmitted through the data line DLj to the pixel electrode.

The plurality of pixels PX may include a first color pixel PX_1, a second color pixel PX_2, and a third color pixel PX_3, each of which represents different primary colors, and may further include pixels for representing colors other than first to third colors or gray-based colors such as white and the like.

In an exemplary embodiment, the first, second, and third colors may be three primary colors such as red, green, and blue, for example.

The first color pixel PX_1, the second color pixel PX_2, and the third color pixel PX_3 provide one dot Dot, and various colors may be realized by controlling luminances of the pixels PX.

One dot Dot may further include pixels for representing different colors, as well as the first color pixel PX_1, the second color pixel PX_2, and the third color pixel PX_3.

Figure 2:
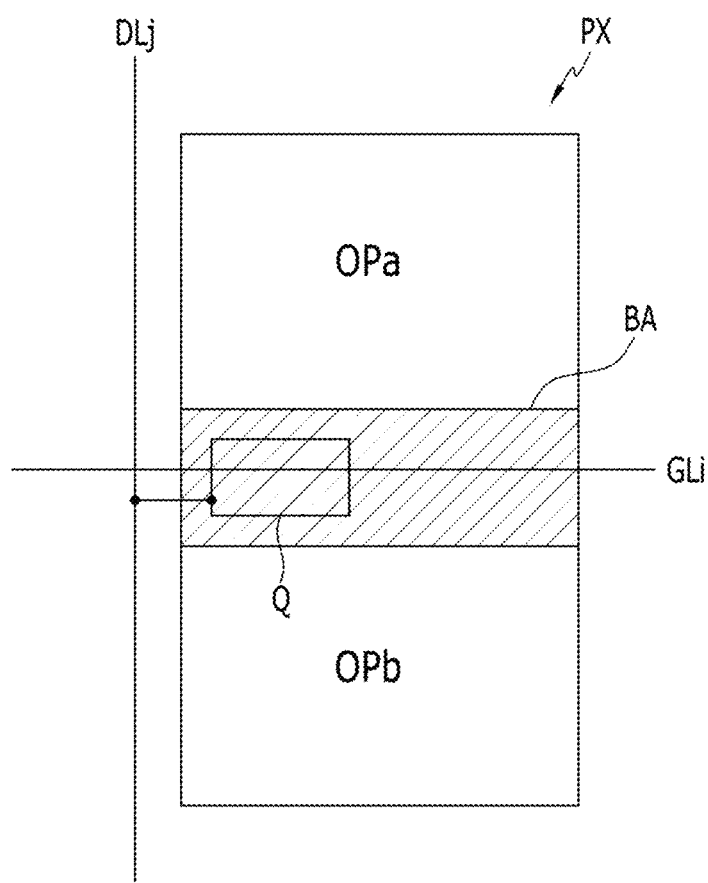
FIG. 2 is a schematic plan view of the exemplary embodiment of one pixel of the display device according to the invention.

Referring to FIG. 2, one pixel PX may include at least one light blocking area BA and at least one of light transmitting areas OPa and OPb.

In an exemplary embodiment one pixel PX may include the first and second light transmitting areas OPa and OPb adjacent to each other, and the light blocking area BA interposed therebetween, for example.

The first and second light transmitting areas OPa and OPb are areas where an image is normally displayed, that is, areas where light may be transmitted, and the light blocking area BA is not an area where the image is intended to be displayed, that is, an area where the light may not be generally transmitted.

In the display device according to the exemplary embodiment of the invention, one pixel PX may include a plurality of subpixels.

For one image signal, different subpixels of one pixel PX may display the image according to different gamma curves or the same gamma curve.

Referring to FIG. 2, the first light transmitting area OPa may be the light transmitting area of one subpixel, and the second light transmitting area OPb may be the light transmitting area of another subpixel.

The gate line GLi, the switching element Q, and the like may be disposed in the light blocking area BA.

A detailed structure of the display device according to the exemplary embodiment of the invention will be described with reference FIGS. 3 to 11 along with the aforementioned drawings.

Figure 3:
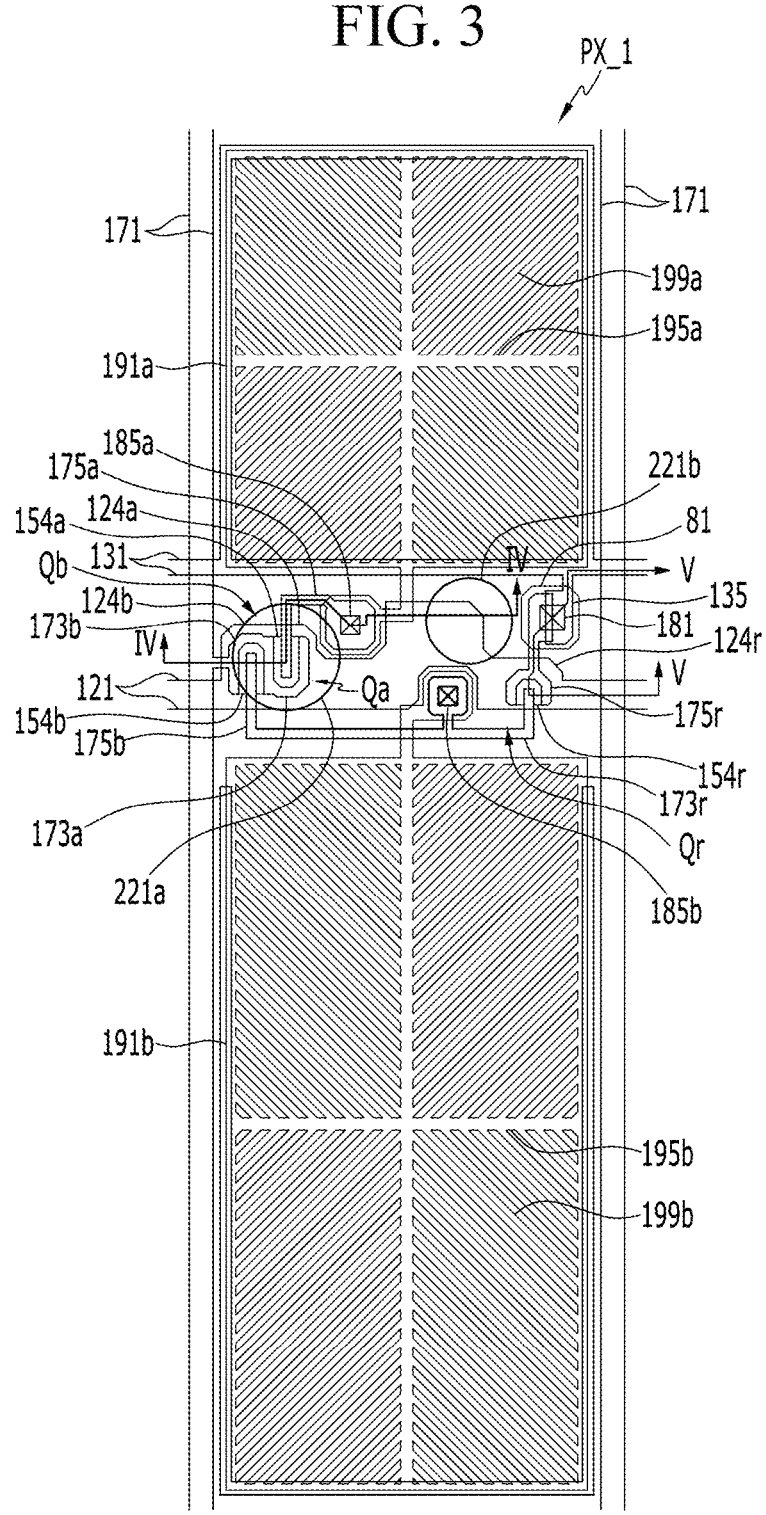
FIG. 3 is a plan view of one pixel of the display device according to the exemplary embodiment of the invention.
Figure 4:
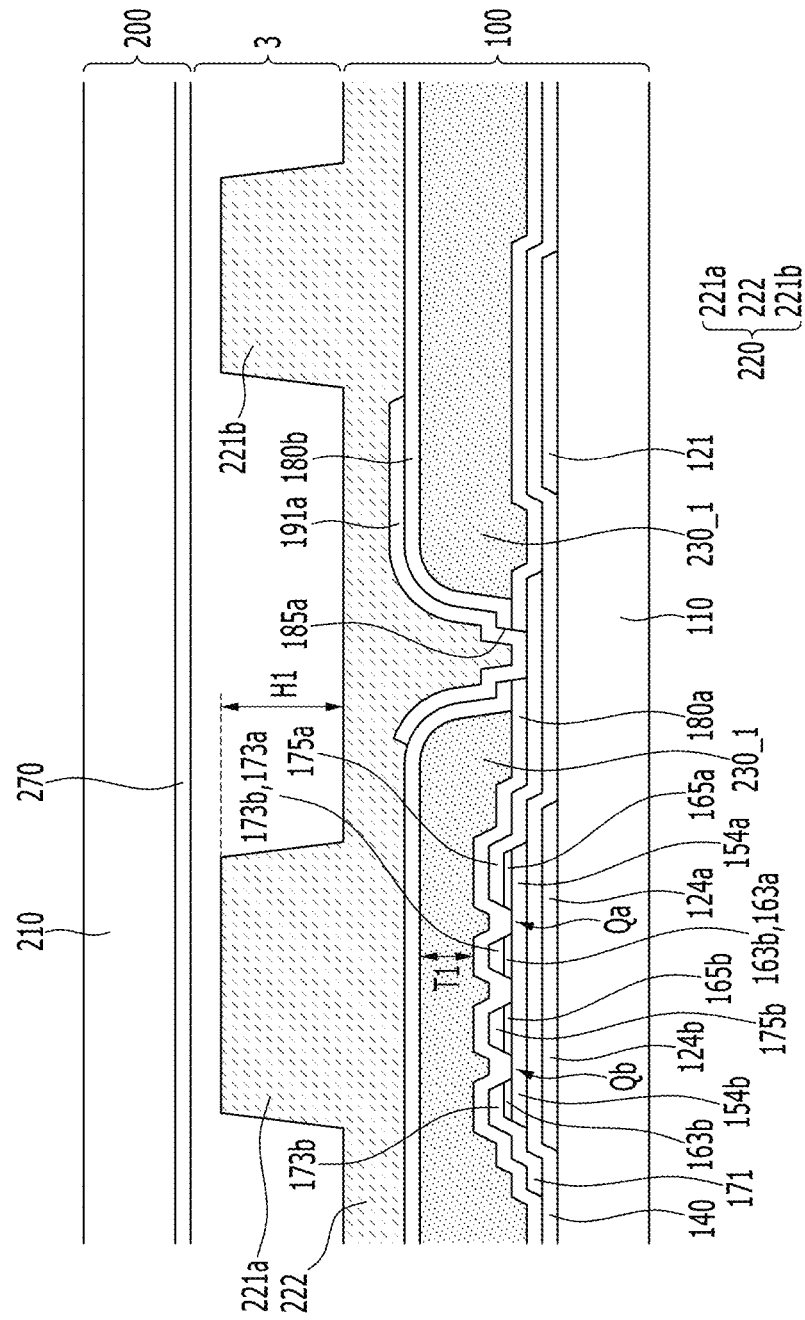
FIG. 4 is a cross-sectional view of the display device illustrated in FIG. 3 taken along line IV-IV.
Figure 5:
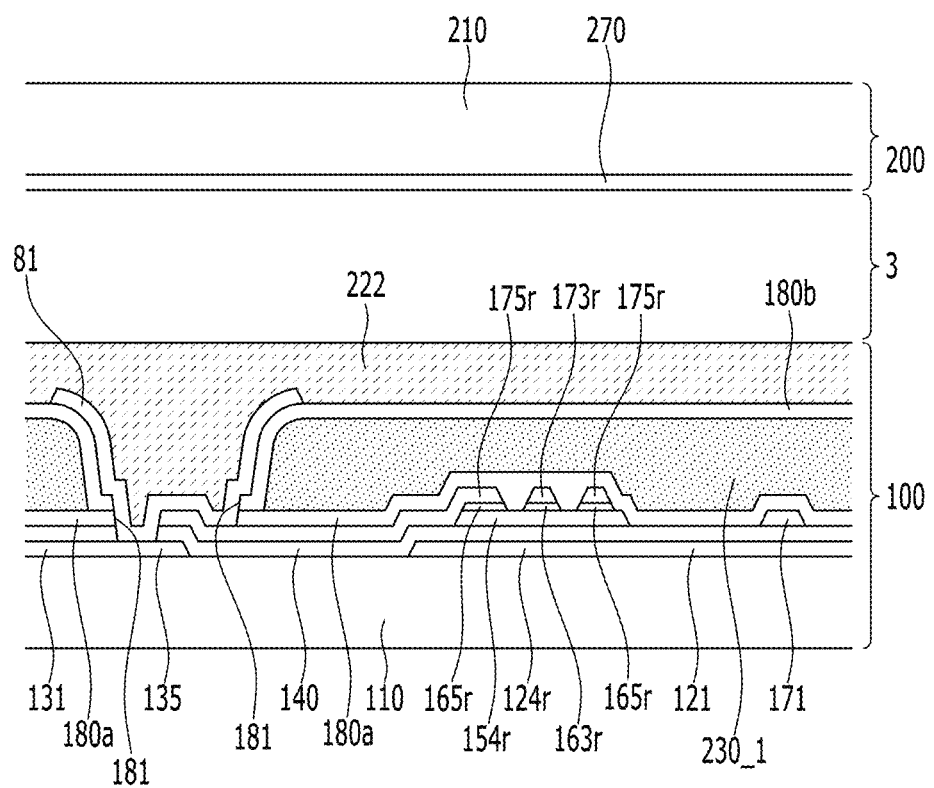
FIG. 5 is a cross-sectional view of the display device illustrated in FIG. 3 taken along line V-V.

Referring first to FIGS. 3 to 5, the first color pixel PX_1 for representing the first color will be described.

FIG. 3 is a plan view of one pixel of the display device according to the exemplary embodiment of the invention, FIG. 4 is a cross-sectional view of the display device illustrated in FIG. 3 taken along line IV-IV, and FIG. 5 is a cross-sectional view of the display device illustrated in FIG. 3 taken along line V-V.

The display device according to the exemplary embodiment of the invention may include lower and upper panels 100 and 200 facing each other, and a liquid crystal layer 3 interposed between the two display panels 100 and 200.

The lower panel 100 will be described first. Gate conductors including a plurality of gate lines 121 and a plurality of reference voltage lines 131 are disposed on a substrate 110.

Each gate line 121 mainly extends in a horizontal direction, and may include a first gate electrode 124a, a second gate electrode 124b, and a third gate electrode 124r that protrude in a vertical direction.

Each reference voltage line 131 may mainly extend in the horizontal direction while being separated from the gate line 121.

The reference voltage line 131 may transmit a reference voltage that may be an alternating current ("AC") voltage or a constant direct current ("DC") voltage such as a common voltage or the like.

The reference voltage line 131 may include a protruding portion 135 that upwardly or downwardly extends from its horizontally extending portion.

A gate insulating layer 140 is disposed on the gate conductors, and a semiconductor layer including a first semiconductor 154a, a second semiconductor 154b, and a third semiconductor 154r is disposed the gate insulating layer 140.

The first and second semiconductors 154a and 154b may be connected to each other.

The first semiconductor 154a may overlap the first gate electrode 124a, the second semiconductor 154b may overlap the second gate electrode 124b, and the third semiconductor 154r may overlap the third gate electrode 124r.

In an exemplary embodiment, the semiconductor layer may include amorphous silicon, polycrystalline silicon, a metal oxide, or the like, for example.

A plurality of ohmic contacts 163a, 163b, 163r, 165a, 165b, and 165r may be disposed on the semiconductor layer.

In an exemplary embodiment, the ohmic contacts 163a, 163b, 163r, 165a, 165b, and 165r may include a silicide or a material such as n+ hydrogenated amorphous silicon in which an n-type impurity is doped at a high concentration, for example.

In another exemplary embodiment, the ohmic contacts 163a, 163b, 163r, 165a, 165b, and 165r may be omitted.

Data conductors including a plurality of data lines 171 including a first source electrode 173a and a second source electrode 173b, a first drain electrode 175a, a second drain electrode 175b, a third source electrode 173r, and a third drain electrode 175r are disposed on the ohmic contacts 163a, 163b, 163r, 165a, 165b, and 165r and the gate insulating layer 140.

Each data line 171 transmits a data signal, and mainly extends in the vertical direction to cross the gate line 121 and the reference voltage line 131.

The first source electrode 173a protrudes from the data line 171 toward the first gate electrode 124a to face the first drain electrode 175a, and the second source electrode 173b protrudes from the data line 171 toward the second gate electrode 124b to face the second source electrode 173b.

The first and second source electrodes 173a and 173b are connected to each other, and the second drain electrodes 175b and the third source electrode 173r are connected to each other.

The third source electrode 173r and the third drain electrode 175r face each other.

One of end portions of the third drain electrode 175r that does not face the third source electrode 173r may be adjacent to or overlap some of the protruding portions 135 of the reference voltage line 131.

The first gate electrode 124a, the first source electrode 173a, and the first drain electrode 175a form a first TFT Qa along with the first semiconductor 154a to serve as a first switching element, the second gate electrode 124b, the second source electrode 173b, and the second drain electrode 175b form a second TFT Qb along with the second semiconductor 154b to serve as a second switching element, and the third gate electrode 124r, the third source electrode 173r, and the third drain electrode 175r form a third TFT Qr along with the third semiconductor 154r to serve as a voltage-dividing switching element.

Channels of the first, second, and third TFTs Qa, Qb, and Qr are disposed in the first, second, third semiconductors 154a, 154b, and 154r between the first, second, third source electrodes 173a, 173b, and 173r and the first, second, third drain electrodes 175a, 175b, and 175r.

The gate line 121, the reference voltage line 131, and the first to third TFTs Qa, Qb, and Qr may be disposed in the aforementioned light blocking area BA illustrated in FIG. 2.

The light blocking area BA included in the first color pixel PX_1 is not limited to have the above configuration, and may be modified to have various configurations including at least one TFT.

A first insulating layer 180a is disposed on the data conductors and exposed portions of the semiconductors 154a, 154b, and 154r.

The first insulating layer 180a may include an organic insulating material or an inorganic insulating material, and may include a single layer or multiple layers.

A first color filter 230_1 for representing the first color may be disposed on the first insulating layer 180a.

In an exemplary embodiment, the first color filter 230_1 may display one of three primary colors such as red, green, and blue, or four primary colors. However, the first color filter 230_1 is not limited to the three primary colors of red, green, and blue, and may represent cyan, magenta, yellow, white-based colors, and the like, for example.

In the illustrated exemplary embodiment, the first color filter 230_1 is exemplarily described to represent red, for example.

The first color filter 230_1 may have a thickness T1 that varies depending on its positions, and the variance of the thickness T1 may be dependent upon a planarization characteristic of the first color filter 230_1 and a height of a lower surface thereof.

The first color filter 230_1 may be elongated along a corresponding pixel column.

Openings (not shown) that are respectively defined in a region of the first and second drain electrodes 175a and 175b may be defined in the first color filter 230_1.

A second insulating layer 180b may be further disposed on the first color filter 230_1.

The second insulating layer 180b may include an inorganic insulating material or an organic insulating material.

As an overcoat for the first color filter 230_1, the second insulating layer 180b may prevent the first color filter 230_1 from being exposed, and may provide a smooth surface.

The second insulating layer 180b may prevent impurities such as a pigment of the first color filter 230_1 and the like from flowing into the liquid crystal layer 3.

In another exemplary embodiment, the second insulating layer 180b may be omitted.

A first contact hole 185a for partially exposing the first drain electrode 175a, and a second contact hole 185b for partially exposing the second drain electrode 175b may be defined in the first and second insulating layers 180a and 180b.

The first and second contact holes 185a and 185b may be disposed inside the openings of the first color filter 230_1.

A contact hole 181 for partially exposing both the third drain electrode 175r and the protruding portion 135 of the reference voltage line 131 may be defined in the gate insulating layer 140 and the first and second insulating layers 180a and 180b.

A plurality of pixel electrodes and a plurality of contact assistants 81 are disposed on the second insulating layer 180b.

One pixel electrode may consist of one electrode, or may include a plurality of subpixel electrodes.

In the illustrated exemplary embodiment, one pixel electrode including a first subpixel electrode 191a and a second subpixel electrode 191b will be exemplarily described.

The first subpixel electrode 191a may be substantially disposed in the aforementioned first light transmitting area OPa illustrated in FIG. 2, while the second subpixel electrode 191b may be substantially disposed in the second light transmitting area OPb.

Referring to FIG. 3, the first and second subpixel electrodes 191a and 191b may face each other while interposing the gate line 121, the reference voltage line 131, and the first to third TFTs Qa, Qb, and Qr therebetween.

However, arrangement and shapes of the first and second subpixel electrodes 191a and 191b are not limited to the drawings, and the shapes of the first and second subpixel electrodes 191a and 191b may be modified in various ways.

In an exemplary embodiment, each of the first and second subpixel electrodes 191a and 191b may have, for example, an overall quadrangular shape, for example.

Each of the first and second subpixel electrodes 191a and 191b may include cross-shaped stem portions 195a and 195b including a horizontal stem portion and a vertical stem portion, and a plurality of minute branch portions 199a and 199b outwardly extending from the cross-shaped stem portions 195a and 195b.

The first subpixel electrode 191a and/or the second subpixel electrode 191b may be divided into a plurality of subregions by the cross-shaped stem portions 195a and 195b.

In an exemplary embodiment, the minute branch portions 199a and 199b obliquely extend from the cross-shaped stem portions 195a and 195b, and may extend to form an angle of about 45 degrees (°) or about 135° with reference to the gate line 121, for example.

Directions in which the minute branch portions 199a and 199b of the adjacent subregions extend are different, and for example, they may be perpendicular to each other.

Each of the first and second subpixel electrodes 191a and 191b may further include an outer stem portion (not shown) for surrounding its outer sides.

The first and second subpixel electrodes 191a and 191b are physically and electrically connected to the first drain electrode 175a and the second drain electrode 175b through the contact holes 185a and 185b, respectively.

The first subpixel electrode 191a may be applied with the data voltage from the drain electrode 175a, and the second subpixel electrode 191b may be applied with a divided voltage between the data voltage transmitted through the second drain electrode 175b and the reference voltage transmitted through the reference voltage line 131.

The third drain electrode 175r and the protruding portion 135 of the reference voltage line 131 may be connected to each other through the contact assistants 81 in the contact hole 181.

In an exemplary embodiment, the first subpixel electrode 191a, the second subpixel electrode 191b, and the contact assistants 81 may include a transparent conductive material such as indium tin oxide ("ITO"), indium zinc oxide ("IZO"), a metal foil, etc.

Since the arrangement and shape of the pixel PX, the structure of the TFT, and the shape of the pixel electrode that are described are merely exemplary embodiments, and may be modified in various ways.

A light blocking member 220 is disposed on the first and second subpixel electrodes 191a and 191b and the contact assistants 81.

The light blocking member 220 is also referred to as a black matrix.

The light blocking member 220 disposed in the first color pixel PX_1 includes a main light blocking portion 222, a first spacer 221a, and a second spacer 221b.

The main light blocking portion 222 may be generally disposed in the light blocking area BA in which the first to third TFTs Qa, Qb, and Qr are disposed, and may have an overall smooth upper surface.

The main light blocking portion 222 may prevent light leakage between the first light transmitting area OPa in which the first subpixel electrode 191a is disposed and the second light transmitting area OPb in which the second subpixel electrode 191b is disposed.

The main light blocking portion 222 may include a portion for covering the contact holes 185a, 185b, and 181, and the portion fills large steps on the contact holes 185a, 185b, and 181 to make a smooth surface and to prevent light leakages around the steps.

In an exemplary embodiment, a thickness of the main light blocking portion 222 may be about 1 micrometer (nm) to about 2.5 nm, and more specifically, about 2 nm, for example.

The first and second spacers 221a and 221b are separated from each other and are connected to the main light blocking portion 222.

The first and second spacers 221a and 221b may be disposed on the first to third TFTs Qa, Qb, and Qr and/or the signal lines such as the gate line 121, the reference voltage line 131, and the data line 171.

In an exemplary embodiment, the first spacer 221a may be disposed on the first and second TFTs Qa and Qb, the second spacer 221b may be disposed on a periphery of the TFT, that is, on the outside where the TFTs are not disposed, and may be disposed, for example, on the gate line 121, but the invention is not limited thereto.

The first and second spacers 221a and 221b may serve as sub-spacers to maintain and support a cell gap between the upper and lower panels 200 and 100 when a distance between the upper and lower panels 200 and 100 of the display device is narrow due to external pressure.

In this case, heights H1 of the first and second spacers 221a and 221b from an upper surface of the main light blocking portion 222 are smaller than a distance between the upper surface of the main light blocking portion 222 of the lower panel 100 and the upper panel 200, that is, the cell gap.

In an alternative exemplary embodiment, either one of the first spacer 221a and the second spacer 221b may be a main spacer having an upper surface that is higher than that of the other.

In general, the main spacer may serve to maintain and support the cell gap between the upper and lower panels 200 and 100.

When there are a large number of the main spacers, bubbles may be generated in the liquid crystal layer 3 because adjusting the cell gap between the upper and lower panels 200 and 100 according to variations in volumes of the liquid crystal layer 3 due to environmental changes such as temperature and the like may be difficult, so the number of the main spacers may be limited.

On the contrary, when external pressure is applied to the display device, the sub-spacers operate as backups for the main spacer by maintaining the cell gap between the upper and lower panels 200 and 100, and when there are a small number of the sub-spacers and the main spacer is permanently deformed to generate display defects such as smudges, the display device having an overall larger number of the sub-spacers may be more advantageous.

In an exemplary embodiment, a height from the upper surface of the main light blocking portion 222 to an upper surface of the main spacer may be, for example, about 1 μm when the thickness of the main light blocking portion 222 is, for example, about 2 μm, and heights from the upper surface of the main light blocking portion 222 to upper surfaces of the sub-spacers may be, for example, about 0.45 μm to about 0.55 μm.

The heights of the first and second spacers 221a and 221b from the upper surface of the main light blocking portion 222 according to the illustrated exemplary embodiment may be, for example, about 0.45 μm to about 0.55 μm.

However, the invention is not limited thereto, and the description will be made based on these reference values.

In an exemplary embodiment, the widths of the first and second spacers 221a and 221b may be about 30 μm to about 50 μm, but the widths of the first and second spacers 221a and 221b are not limited thereto.

Portions having different thicknesses such as the main light blocking portion 222, the first spacer 221a, and the second spacer 221b of the light blocking member 220 may be defined using one photomask.

In this case, the photomask may include a transparent region where the light is transmitted, an opaque region where the light is blocked, and a halftone region where the light is partially transmitted, and the halftone region may include a portion that corresponds to the main light blocking portion 222.

This will be described in detail below.

The light blocking member 220 may further include a light blocking portion (not shown) for covering at least one of the gate line 121, the reference voltage line 131, and the data line 171.

Particularly, the light blocking portion overlapping the data line 171 may prevent the light leakage between the pixels PX.

In an exemplary embodiment, the light blocking member 220 may include a pigment such as black carbon and a photosensitive organic material.

As described in the exemplary embodiment of the invention, when the first color filter 230_1 and the light blocking member 220 are disposed in the lower panel 100 along with the first to third TFTs Qa, Qb, and Qr, an alignment error may be reduced since it is easy to make alignments between the light blocking member 220 and between the first color filter 230_1 and the pixel electrode and the TFTs Qa, Qb, and Qr.

Accordingly, the light leakage or reduction in an aperture ratio of the display device due to misalignments between these components may be prevented, and transmittance may be enhanced.

An alignment layer is disposed on the light blocking member 220, and the alignment layer may be a vertical alignment layer.

The upper panel 200 will now be described. A facing electrode 270 may be disposed on a substrate 210.

The facing electrode 270 may be provided as a whole plate to have a planar shape on an entire surface of the substrate 210.

In an exemplary embodiment, the facing electrode 270 may transmit the constant common voltage.

In an exemplary embodiment, the facing electrode 270 may include a transparent conductive material such as ITO, IZO, a metal foil, etc.

In an exemplary embodiment, an alignment layer is disposed on the facing electrode 270, and the alignment layer may be a vertical alignment layer.

The liquid crystal layer 3 includes a plurality of liquid crystal molecules (not shown).

The liquid crystal molecules may have negative dielectric anisotropy, and may be aligned such that they are substantially perpendicular to the substrates 110 and 210 while no electric field is generated in the liquid crystal layer 3.

The liquid crystal molecules may be pretilted in predetermined directions when no electric field is generated in the liquid crystal layer 3.

In an exemplary embodiment, the liquid crystal molecules may be pretilted in directions that are substantially parallel to the minute branch portions 199a and 199b of the first and second subpixel electrodes 191a and 191b.

In order to maintain a charged voltage, the first subpixel electrode 191a may form a first liquid crystal capacitor along with the facing electrode 270 while the second subpixel electrode 191b may form a second liquid crystal capacitor along with the facing electrode 270.

Now, referring to FIGS. 6 to 8 and comparing with the first color pixel PX_1 according to the aforementioned exemplary embodiment illustrated and described in FIGS. 3 to 5, a second color pixel PX_2 for representing the second color will be described.

Figure 6:
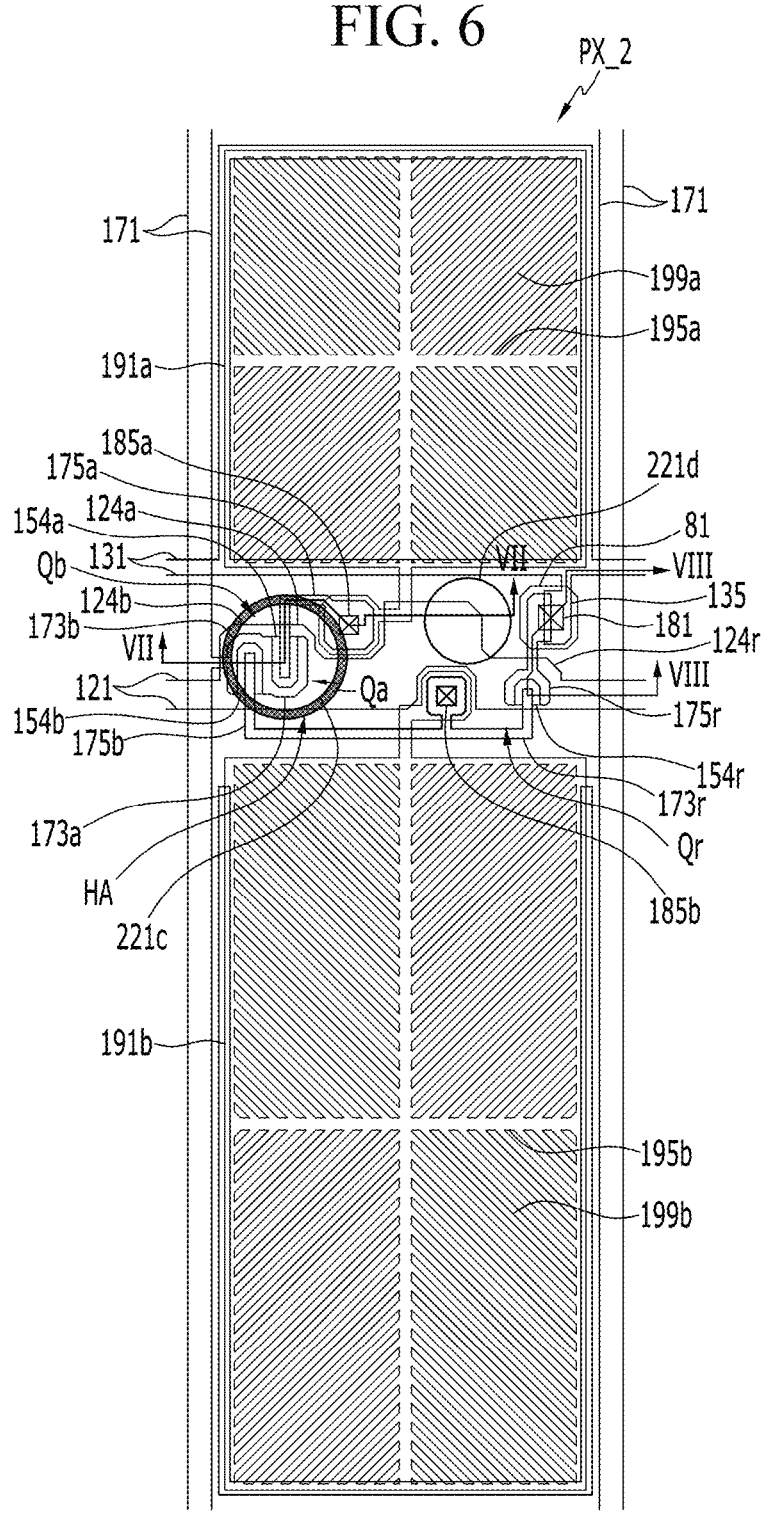
FIG. 6 is a plan view of the exemplary embodiment of one pixel of the display device according to the invention.
Figure 7:
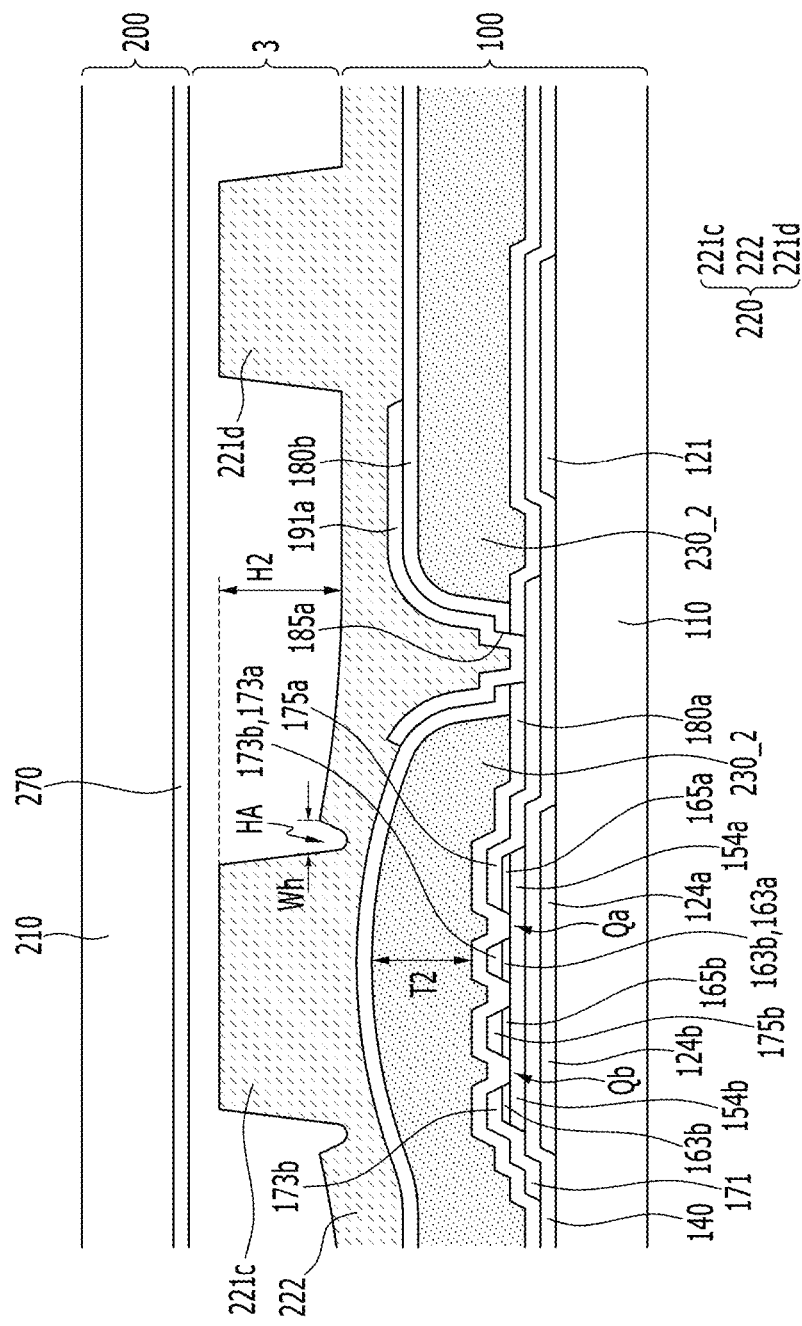
FIG. 7 is a cross-sectional view of the display device illustrated in FIG. 6 taken along line VII-VII.
Figure 8:
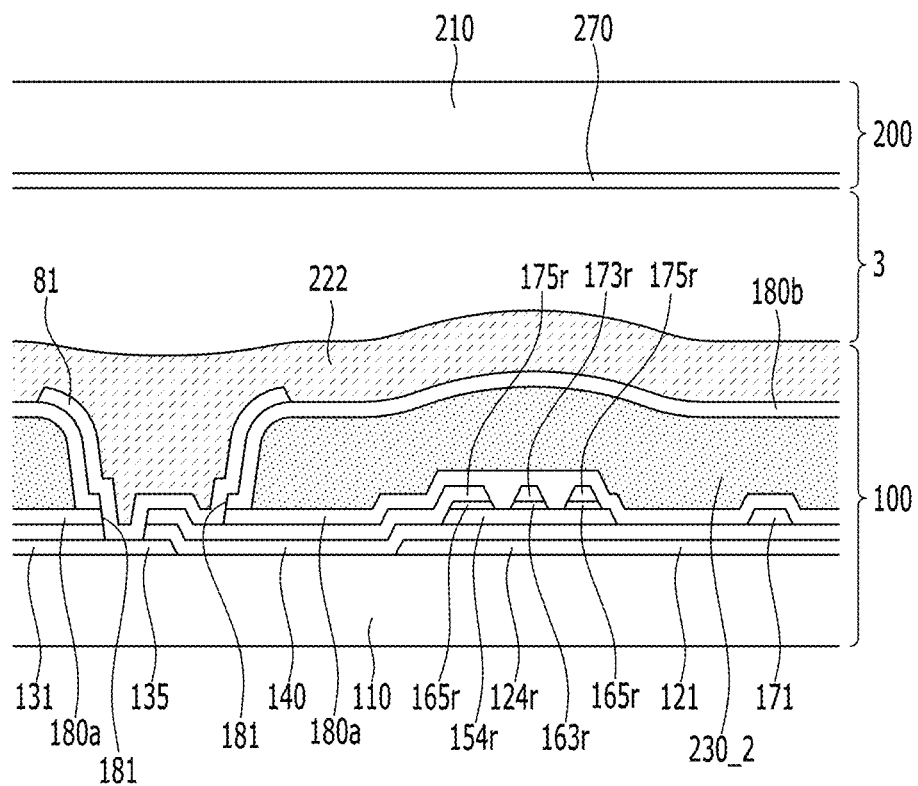
FIG. 8 is a cross-sectional view of the display device illustrated in FIG. 6 taken along line VIII-VIII.

FIG. 6 is a plan view of one pixel of the display device according to the exemplary embodiment of the invention, FIG. 7 is a cross-sectional view of the display device illustrated in FIG. 6 taken along line VII-VII, and FIG. 8 is a cross-sectional view of the display device illustrated in FIG. 6 taken along line VIII-VIII.

Referring to FIGS. 6 to 8, since a structure of the second color pixel PX_2 of the display device according to the exemplary embodiment of the invention is substantially the same as the aforementioned first color pixel PX_1, only differences therebetween will be described.

Similar to the aforementioned exemplary embodiment, the second color pixel PX_2 may include at least one TFT such as the first to third TFTs Qa, Qb, and Qr disposed on the substrate 110, and a first insulating layer 180a disposed thereon.

A second color filter 230_2 may be disposed on the first insulating layer 180a.

In an exemplary embodiment, the second color filter 230_2 may represent one of three primary colors such as red, green, and blue or four primary colors, or one of primary colors such as cyan, magenta, yellow, and white-based colors.

The second color filter 230_2 represents a different color from the first color filter 230_1.

In the illustrated exemplary embodiment, the second color filter 230_2 will be exemplarily described to represent green.

The second color filter 230_2 may have a thickness T2 that varies depending on its positions, and the variance of the thickness T2 may be dependent upon a planarization characteristic of the second color filter 230_2 and a height of a lower surface thereof.

Particularly, in the illustrated exemplary embodiment, the planarization characteristic of the second color filter 230_2 is worse than that of the first color filter 230_1 in terms of characteristics of a material.

Accordingly, as illustrated in FIGS. 7 and 8, a height of an upper surface of the second color filter 230_2 varies as a height of a lower surface of the second color filter 230_2 varies.

In this case, a degree of variations in the thickness T2 of the second color filter 230_2 according to the positions is small.

Accordingly, the upper surface of the second color filter 230_2 disposed on a multi-layered structure such as the first to third TFTs Qa, Qb, and Qr for forming a high step is provided to be higher than its periphery.

In an exemplary embodiment, when the second color filter 230_2 represents green, the height of the upper surface of the second color filter 230_2 disposed on the TFTs Qa, Qb, and Qr of the second color pixel PX_2 may be higher by about 0.3 μm to about 0.4 μm than that of the upper surface of the first color filter 230_1 (See FIG. 4) disposed on the TFTs Qa, Qb, and Qr of the aforementioned first color pixel PX_1.

That is, in an exemplary embodiment, the thickness T2 of the second color filter 230_2 disposed on the TFTs Qa, Qb, and Qr of the second color pixel PX_2 may be greater by about 0.3 μm to about 0.4 μm than the thickness T1 of the first color filter 230_1 disposed on the TFTs Qa, Qb, and Qr of the first color pixel PX_1.

The first and second subpixel electrodes 191a and 191b of the second color pixel PX_2 and the light blocking member 220 disposed on the contact assistants 81 include a main light blocking portion 222, a third spacer 221c, and a fourth spacer 221d.

Since the main light blocking portion 222 disposed in the second color pixel PX_2 is substantially the same as the main light blocking portion 222 disposed in the aforementioned first color pixel PX_1 (See FIG. 4), a detailed description thereof will be omitted.

The third and fourth spacers 221c and 221d are separated from each other, and are connected to the main light blocking portion 222.

The third and fourth spacers 221c and 221d may be disposed on the first to third TFTs Qa, Qb, and Qr and/or the signal lines such as the gate line 121, the reference voltage line 131, and the data line 171.

In an exemplary embodiment, the third spacer 221c may be disposed on the first and second TFTs Qa and Qb, and the fourth spacer 221d may be disposed on peripheries of the TFTs, that is, on the outside where the TFTs are not disposed, and may be disposed, for example, on the gate line 121, but the invention is not limited thereto.

The third and fourth spacers 221c and 221d may be the sub-spacers.

Thus, heights H2 of the third and fourth spacers 221c and 221d from the upper surface of the main light blocking portion 222 are smaller than the distance between the upper surface of the main light blocking portion 222 of the lower panel 100 and the upper panel 200, that is, the cell gap.

In an exemplary embodiment, when the thickness of the main light blocking portion 222 is about 2 μm, the heights from the upper surface of the main light blocking portion 222 to the upper surface of the third and fourth spacers 221c and 221d may be, for example, about 0.45 μm to about 0.55 μm.

A furrow HA is disposed at edges of the third spacer 221c that is disposed on the TFT.

The furrow HA is provided along the edges of the third spacer 221c, that is, a border between the third spacer 221c and the main light blocking portion 222, and may form a closed curve for enclosing the third spacer 221c.

A width Wh of the furrow HA may be about 1 μm to about 2 μm, but the invention is not limited thereto.

In an exemplary embodiment, the depth of the furrow HA in the main light blocking portion 222 may be about 0.1 μm to about 0.3 μm, for example, but the invention is not limited thereto.

In addition, various characteristics and effects of the aforementioned first color pixel PX_1 may be identically applied to the second color pixel PX_2.

Now, referring to FIGS. 9 to 11 and comparing with the first color pixel PX_1 according to the aforementioned exemplary embodiment illustrated and described in FIGS. 3 to 5, the third color pixel PX_3 for representing the third color will be described.

Figure 9:
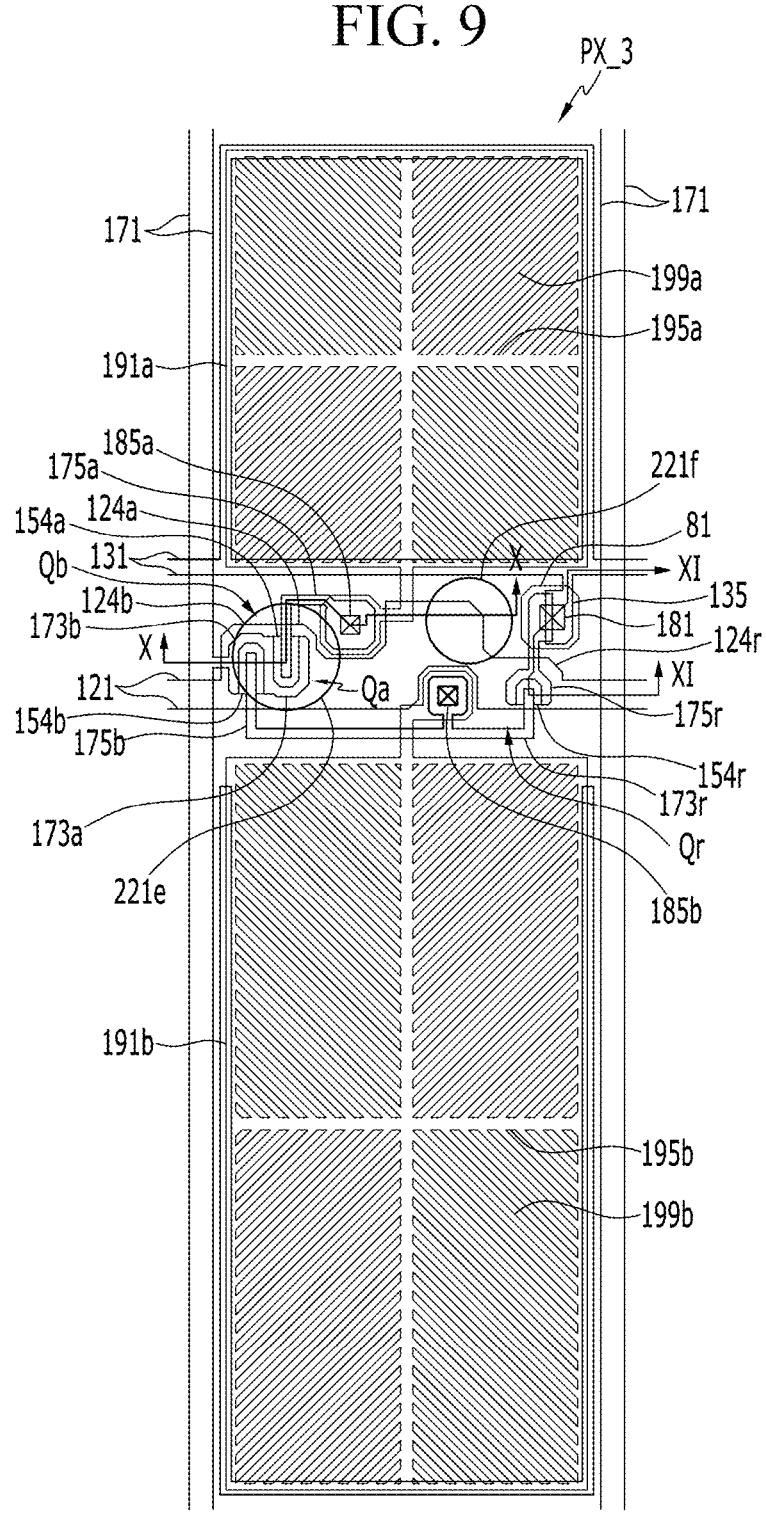
FIG. 9 is a plan view of the exemplary embodiment of one pixel of the display device according to the invention.
Figure 10:
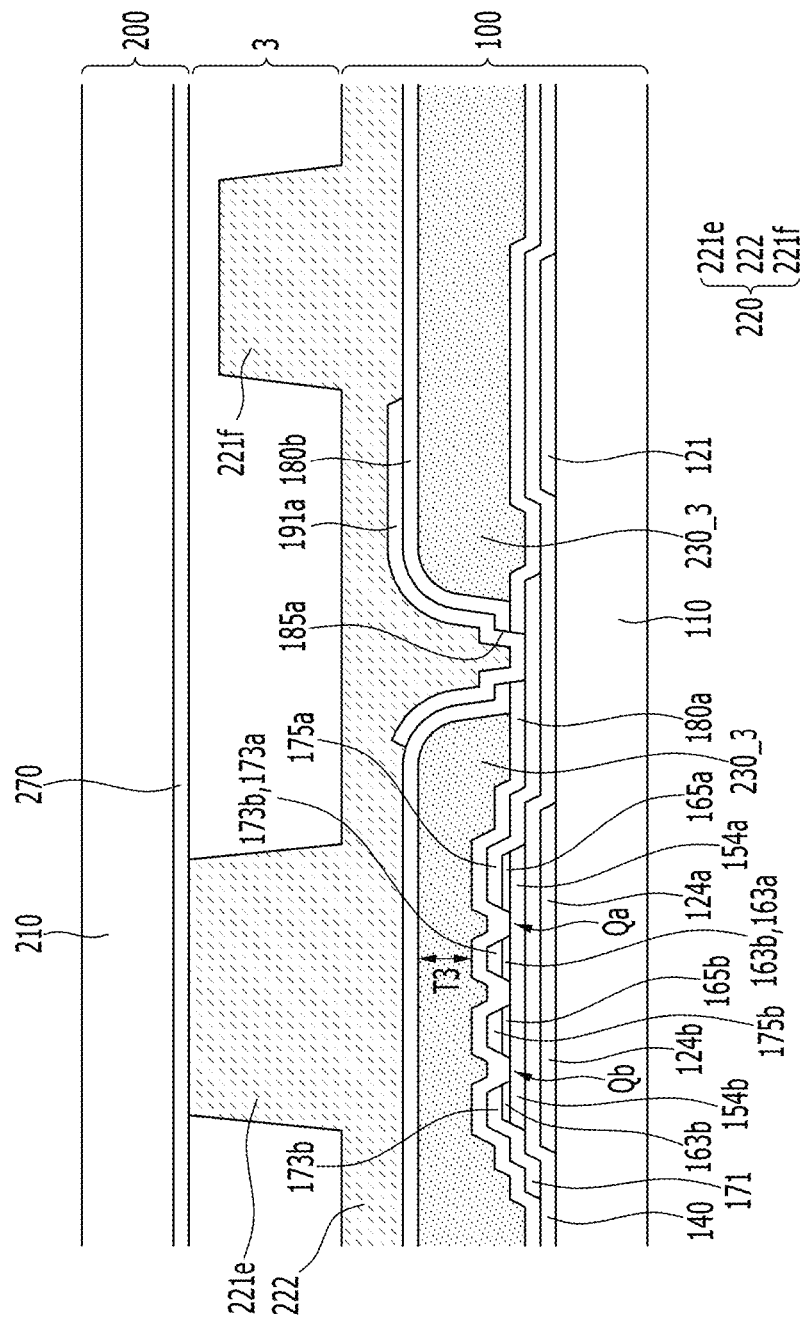
FIG. 10 is a cross-sectional view of the display device illustrated in FIG. 9 taken along line X-X.
Figure 11:
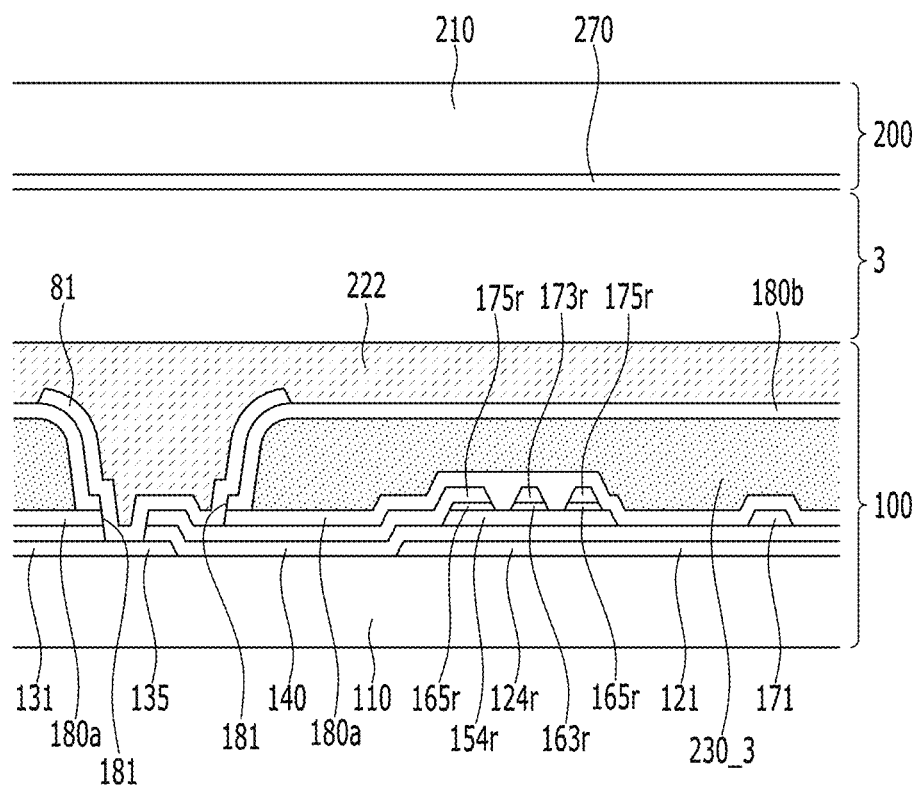
FIG. 11 is a cross-sectional view of the display device illustrated in FIG. 9 taken along line XI-XI.

FIG. 9 is a plan view of one pixel of the display device according to the exemplary embodiment of the invention, FIG. 10 is a cross-sectional view of the display device illustrated in FIG. 9 taken along line X-X, and FIG. 11 is a cross-sectional view of the display device illustrated in FIG. 9 taken along line XI-XI.

Referring to FIGS. 9 to 11, since a structure of the third color pixel PX_3 of the display device according to the exemplary embodiment of the invention is substantially the same as the aforementioned first color pixel PX_1, only differences therebetween will be described.

Similar to the aforementioned exemplary embodiment, the third color pixel PX_3 may include at least one TFT such as the first to third TFTs Qa, Qb, and Qr disposed on the substrate 110, and a first insulating layer 180a disposed thereon.

A third color filter 230_3 may be disposed on the first insulating layer 180a.

In an exemplary embodiment, the third color filter 230_3 may display one of three primary colors such as red, green, and blue or four primary colors, or one of primary colors such as cyan, magenta, yellow, and white-based colors.

The third color filter 230_3 represents a different color from the first color filter 230_1 and the second color filter 230_2.

In the illustrated exemplary embodiment, the third color filter 230_3 will be exemplarily described to represent blue.

The third color filter 230_3 may have a thickness T3 that varies depending on its positions, and the variance of the thickness T3 varies may be dependent upon a planarization characteristic of the third color filter 230_3 and a height of a lower surface thereof.

In one exemplary embodiment of the invention, the third color filter 230_3 may have a better planarization characteristic of a material than the second color filter 230_2.

Accordingly, in the display device according to the exemplary embodiment of the invention, the planarization characteristic of the second color filter 230_2 is worse than those of the first and third color filters 230_1 and 230_3.

When the third color filter 230_3 represents blue, the height of the upper surface of the third color filter 230_3 disposed on the TFTs Qa, Qb, and Qr of the third color pixel PX_3 may be substantially the same as that of the upper surface of the first color filter 230_1 disposed on the TFTs Qa, Qb, and Qr of the aforementioned first color pixel PX_1.

Thus, the height of the upper surface of the third color filter 230_3 may be lower by about 0.3 μm to about 0.4 μm than that of the upper surface of the first color filter 230_1 that is disposed on the TFTs Qa, Qb, and Qr of the first color pixel PX_1.

That is, in the exemplary embodiment, the thickness T2 of the second color filter 230_2 disposed on the TFTs Qa, Qb, and Qr of the second color pixel PX_2 may be greater by about 0.3 μm to about 0.4 μm than the thickness T3 of the third color filter 230_3 disposed on the TFTs Qa, Qb, and Qr of the third color pixel PX_3, for example.

The first and second subpixel electrodes 191a and 191b of the third color pixel PX_3 and the light blocking member 220 disposed on the contact assistants 81 include a main light blocking portion 222, a fifth spacer 221e, and a sixth spacer 221f.

Since the main light blocking portion 222 disposed on the third color pixel PX_3 is substantially the same as the main light blocking portion 222 disposed in the aforementioned first color pixel PX_1, a detailed description thereof will be omitted.

The fifth and sixth spacers 221e and 221f are separated from each other, and are connected to the main light blocking portion 222.

The fifth and sixth spacers 221e and 221f may be disposed on the first to third TFTs Qa, Qb, and Qr and/or the signal lines such as the gate line 121, the reference voltage line 131, and the data line 171.

In an exemplary embodiment, the fifth spacer 221e may be disposed on the first and second TFTs Qa and Qb, and the sixth spacer 221f may be disposed on the peripheries of the TFTs, that is, on the outside where the TFTs are not disposed, and may be disposed, for example, on the gate line 121, but the invention is not limited thereto.

One of the fifth and sixth spacers 221e and 221f may be a sub-spacer, while the other may be a main spacer.

In an exemplary embodiment, the fifth spacer 221e may be the main spacer, while the sixth spacer 221f may be the sub-spacer, for example.

Accordingly, a height of the fifth spacer 221e from the upper surface of the main light blocking portion 222 is greater than that of the sixth spacer 221f from the upper surface of the main light blocking portion 222, and the fifth spacer 221e may substantially contact the upper panel 200.

In an exemplary embodiment, when the thickness of the main light blocking portion 222 is about 2 μm, the height from the upper surface of the main light blocking portion 222 to the upper surface of the fifth spacer 221e may be, for example, about 1 μm.

In this case, the height from the upper surface of the main light blocking portion 222 to the upper surface of the sixth spacer 221f may be, for example, about 0.45 μm to about 0.55 μm.

Unlike as described above, both of the fifth and sixth spacers 221e and 221f may be the sub-spacers.

In this case, at least one of the first and second spacers 221a and 221b disposed in the first color pixel PX_1 or the fourth spacer 221d disposed in the second color pixel PX_2 may be the main spacer.

In addition, various characteristics and effects of the aforementioned first color pixel PX_1 may be identically applied to the third color pixel PX_3.

Now, a manufacturing method of a display device according to an exemplary embodiment of the invention will be described with reference to FIG. 12 along with the aforementioned drawings.

Figure 12:
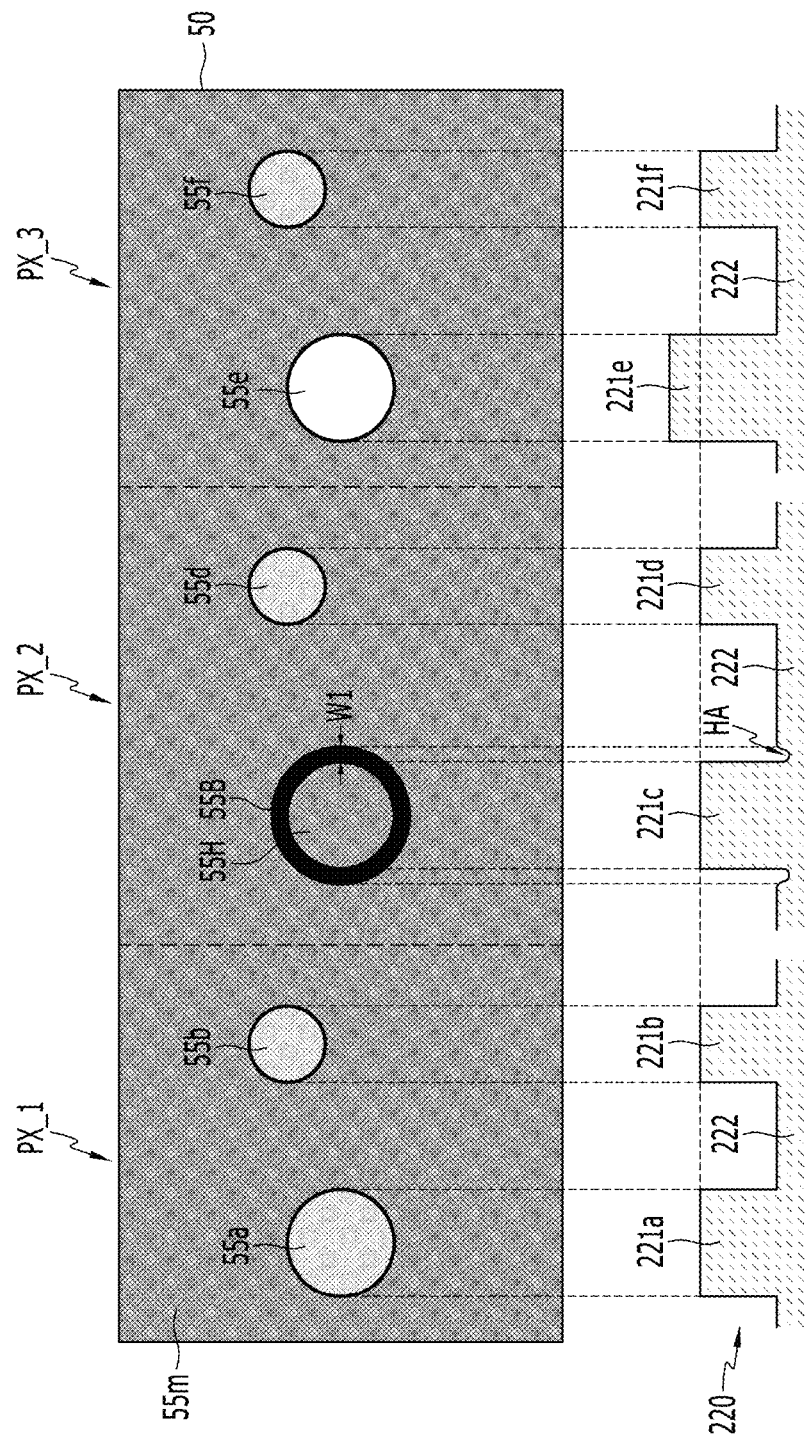
FIG. 12 is a drawing for illustrating a plan view of an exemplary embodiment of a photomask for forming spacers of a display device, and a schematic cross-sectional view of an exemplary embodiment of the spacers corresponding thereto according to the invention.

FIG. 12 is a drawing for illustrating a plan view of a photomask for forming spacers of a display device according to an exemplary embodiment of the invention, and a schematic cross-sectional view of the spacers corresponding thereto.

First, a conductive material is laminated on a substrate 110 including glass or plastic, and is then patterned to form gate conductors including a plurality of gate lines 121 and a plurality of reference voltage lines 131.

Next, an insulating material such as an inorganic insulating material or an organic insulating material is laminated on the gate conductors to form a gate insulating layer 140.

Next, a semiconductor material and a conductive material are sequentially laminated on the gate insulating layer 140 and are then patterned to form a semiconductor layer including a first semiconductor 154a, a second semiconductor 154b, and a third semiconductor 154r and data conductors including a plurality of data lines 171, a first drain electrode 175a, a second drain electrode 175b, a third source electrode 173r, and a third drain electrode 175r.

In this case, an exposure process using a photomask including a halftone may be used.

Next, an organic insulating material or an inorganic insulating material is laminated on the data conductors and exposed portions of the semiconductors 154a, 154b, and 154r to form a first insulating layer 180a.

Next, a material for forming color filters is coated and is then exposed to light to form a first color filter 230_1 disposed in a first color pixel PX_1, a second color filter 230_2 disposed in a second color pixel PX_2, and a third color filter 230_3 disposed in a third color pixel PX_3.

In this case, due to a material characteristic of the second color filter 230_2, a height of an upper surface of the second color filter 230_2 disposed on the TFT may be higher by about 0.3 µm to about 0.4 µm than that of an upper surface of the first color filter 230_1 or the third color filter 230_3 that is disposed on the TFT corresponding to the first color pixel PX_1 or the third color pixel PX_3.

Next, an insulating material is laminated on the first color filter 230_1, the second color filter 230_2, and the third color filter 230_3 to form a second insulating layer 180b.

Next, the gate insulating layer 140, the first insulating layer 180a, and the second insulating layer 180b are patterned to form a first contact hole 185a for exposing the first drain electrode 175a, a second contact hole 185b for exposing the second drain electrode 175b, and a contact hole 181 for partially exposing both the third drain electrode 175r and a protruding portion 135 of the reference voltage line 131.

Next, a conductive material such as ITO, IZO, or the like is laminated and is then patterned to form a plurality of pixel electrodes and a plurality of contact assistants 81.

In an exemplary embodiment, steps of the first to third color filters 230_1, 230_2, and 230_3 are transferred to the second insulating layer 180b disposed on them, and the height of the upper surface of the second insulating layer 180b disposed on the TFT of the first color pixel PX_1 may be higher by about 0.3 µm to about 0.4 µm than that of the upper surface of the second insulating layer 180b disposed on the TFT corresponding to the second color pixel PX_2 or the third color pixel PX_3.

Next, a light blocking material is coated on first and second subpixel electrodes 191a and 191b and the contact assistants 81 to form a light blocking material layer (not shown).

In an exemplary embodiment, a thickness of the light blocking material layer may be about 3 µm, but the invention is not limited thereto.

In this case, depending on a planarization characteristic of the light blocking material layer, the thickness of the light blocking material layer disposed on the TFT of the second color pixel PX_2 and the second color filter 230_2 may be smaller than that of its periphery.

In an exemplary embodiment, the thickness of the light blocking material layer disposed on the TFT of the second color pixel PX_2 and the second color filter 230_2 may have a smaller thickness by about 10% to about 20% than its periphery due to a high step of a lower surface of the light blocking material layer.

Accordingly, in an exemplary embodiment, the height of the upper surface of the light blocking material layer disposed on the TFT of the second color pixel PX_2 and the second color filter 230_2 may be higher by, for example, about 0.24 µm to about 0.36 µm, more specifically, by about 0.27 µm than its periphery or that of the upper surface of the light blocking material layer disposed on the TFT and the color filters 230_1 and 230_3 of the first color pixel PX_1 or the third color pixel PX_3.

Next, the light blocking material layer coated using the photomask 50 as illustrated in FIG. 12 is exposed to light to form a light blocking member 220.

Referring to FIG. 12, the photomask 50 according to an exemplary embodiment of the invention includes a plurality of regions having different transmittances, and the plurality of regions may represent the four different transmittances.

The regions for representing the four transmittances may include a transparent region having the highest light transmittance, a first halftone region where light is partially transmitted, a second halftone region where the light is partially transmitted but has a different transmittance than the first halftone region, and an opaque region having the lowest light transmittance.

In an exemplary embodiment, the transparent region may have light transmittance of about 100%, for example, since it transmits almost all of the light while the opaque region has light transmittance of about 0% because it blocks most of the light, light transmittance of the first halftone region may be, for example, about 19%, and light transmittance of the second halftone region may be, for example, about 16%.

When a remaining portion of the light blocking material layer after light irradiation has a negative photosensitivity, the photomask 50 corresponding to the first color pixel PX_1 may include a main region 55m, which is the second halftone region corresponding to the main light blocking portion 222 of the aforementioned light blocking member 220, a first halftone region 55a corresponding to a first spacer 221a, and a first halftone region 55b corresponding to a second spacer 221b.

The photomask 50 corresponding to the second color pixel PX_2 may include the main region 55m, which is the second halftone region corresponding to the main light blocking portion 222, a second halftone region 55H corresponding to a third spacer 221c, an opaque region 55B provided around the second halftone region 55H, and a first halftone region 55d corresponding to a fourth spacer 221d.

The opaque region 55B is provided to form the third spacer 221c along with the second halftone region 55H, and as described above in FIG. 7, corresponds to a furrow HA provided around the third spacer 221c.

The opaque region 55B may form a closed curve for enclosing the second halftone region 55H.

In an exemplary embodiment, a width of the second halftone region 55H may be about 30 µm to about 40 µm, for example, but the invention is not limited thereto.

In an exemplary embodiment, a width of the opaque region 55B may be about 1 µm to about 2 µm, more specifically, about 1.5 µm, for example, but the invention is not limited thereto.

The photomask 50 corresponding to the third color pixel PX_3 may include a main region 55m, which is the second halftone region corresponding to the main light blocking portion 222, a transparent region 55e corresponding to a fifth spacer 221e, and a first halftone region 55f corresponding to a sixth spacer 221f.

The photomask 50 corresponding to the first and second light transmitting areas OPa and OPb from which the light blocking area BA is excluded may include the opaque region.

When the light blocking material layer is exposed to light and is then provided through the photomask 50 such that the light is irradiated through the transparent region 55e to form the fifth spacer 221e that is the main spacer, the light is partially transmitted (e.g., 19%) through the first halftone regions 55a, 55b, 55d, and 55f to form the first, second, fourth and sixth spacers 221a, 221b, 221d, and 221f that are sub-spacers, and the light is partially transmitted (e.g., 16%) through the main region 55m that is the second halftone region to form a main light blocking portion 222.

Since the second halftone region 55H and the main region 55m, which are the second halftone regions, have the same light transmittance, a height of the upper surface of the light blocking material layer exposed to light through the second halftone region 55H is reduced such that it is substantially the same as that of the light blocking material layer around its periphery.

Accordingly, in an exemplary embodiment, the height of the light blocking material layer exposed to light through the second halftone region 55H increases further by about 0.24 μm to about 0.36 μm, more specifically, by about 0.27 μm than that of the upper surface of the main light blocking portion 222, for example.

However, the light is diffracted by the opaque region 55B for enclosing the periphery of the second halftone region 55H such that an amount of exposure to light increases for the inside of the opaque region 55B.

In an exemplary embodiment, the height of the upper surface of the light blocking material layer exposed to light through the second halftone region 55H substantially increases further by about 0.1 μm to 0.2 μm than that of the upper surface of the main light blocking portion 222, for example.

As a result, in an exemplary embodiment, the height of the light blocking material layer exposed to light through the second halftone region 55H may be provided higher, for example, by about 0.34 μm to about 0.56 μm than that of the upper surface of the main light blocking portion 222 around its periphery.

These values are exemplarily illustrated to have a wide range, and the light blocking material layer exposed to light through the second halftone region 55H may be actually provided to be higher, for example, by about 0.4 μm to about 0.5 μm than the upper surface of the main light blocking portion 222 around its periphery.

As such, in an exemplary embodiment, a portion provided to be higher by about 0.34 μm to about 0.56 μm than the upper surface of the main light blocking portion 222 forms the third spacer 221c that is disposed on the TFT of the aforementioned second color pixel PX_2.

When the light blocking material layer has a positive photosensitivity, transparencies of the photomask 50 described above may be inversely changed.

When the planarization characteristic of the color filter differs from the planarization characteristics of the rest of the color filters, and therefore, as shown in the exemplary embodiment of the invention, the upper surface of the second color filter 230_2 disposed on the TFT is disposed higher than those of the upper surfaces of the first and second color filters 230_1 and 230_3 that are disposed on the TFT, the sub-spacer needs to be disposed on the TFT of the second color pixel PX_2, thereby increasing a cost of the photomask since the photomask 50 includes the region having different transmittance.

However, as shown in the exemplary embodiment of the invention, the photomask 50 corresponding to the sub-spacer disposed on the TFT of the second color pixel PX_2 may include the second halftone region 55H having the same transmittance as the main light blocking portion 222 and the opaque region 55B for enclosing the periphery thereof, such that the third spacer 221c is provided in the second color pixel PX_2 without adding the region having additional transmittance.

Accordingly, the regions having the opaque region 55B where the sub-spacer disposed in the second color pixel PX_2 may be provided are obtained to ensure the sub-spacer's area ratio.

In addition, the number of the sub-spacers may be easily incremented to prevent display defects such as smudges of the display device due to the external pressure.

Figure 13:
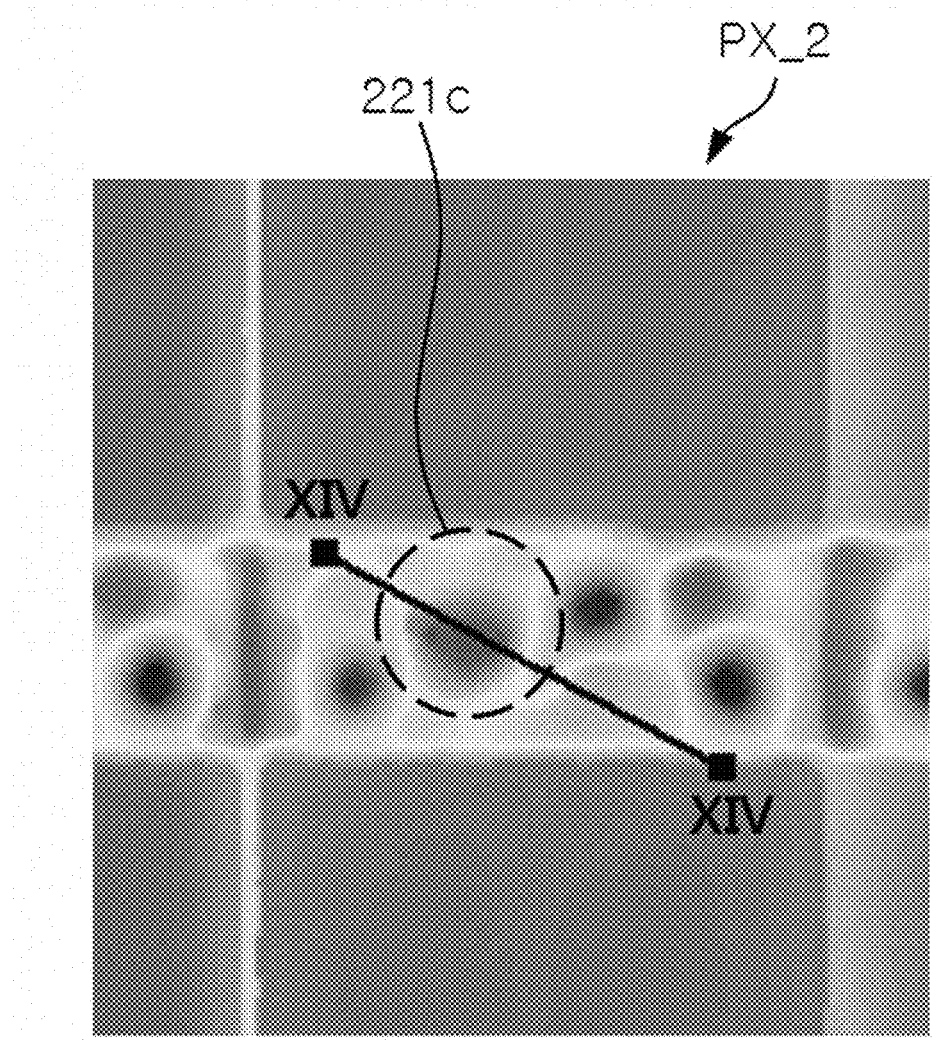
FIG. 13 is a photograph for the exemplary embodiment of measuring a height of an upper surface of a lower panel of the display device according to the invention.
Figure 14:
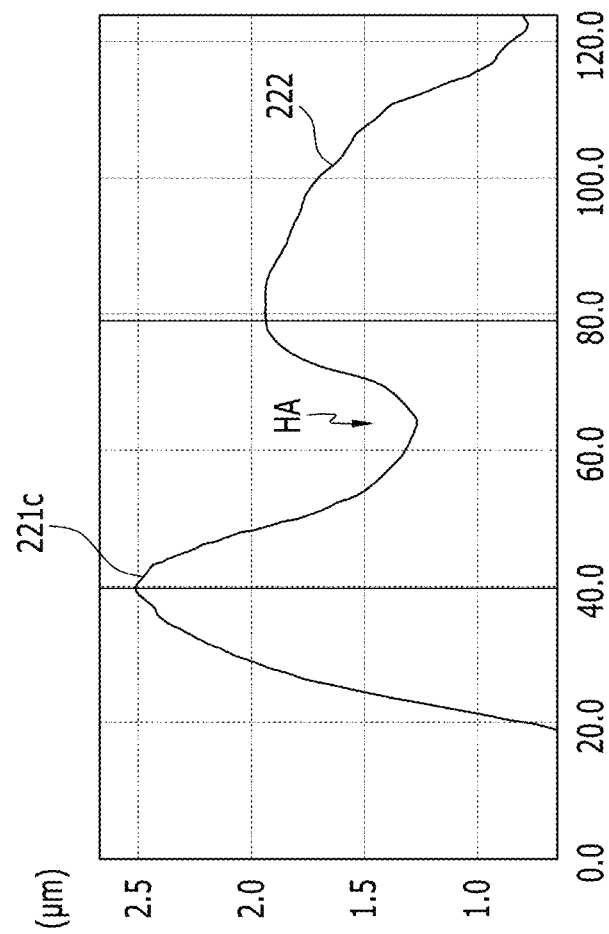
FIG. 14 is a graph for illustrating the height of the upper surface of the lower panel when the lower panel illustrated in FIG. 13 is taken along line XIV-XIV.

FIG. 13 is a photograph for measuring a height of an upper surface of a lower panel of the display device according to the exemplary embodiment of the invention, and FIG. 14 is a graph for illustrating the height of the upper surface of the lower panel when the lower panel illustrated in FIG. 13 is taken along line XIV-XIV.

Referring to FIGS. 13 and 14, a structure of a third spacer 221c provided in a second color pixel PX_2 of a display device manufactured according to an exemplary embodiment of the invention and a periphery thereof will be described. In an exemplary embodiment, since a main light blocking portion 222 is provided to have a height of about 1.9 μm and the third spacer 221c is provided to have a height of about 2.5 μm, for example, it may be seen that the upper surface of the third spacer 221c is provided to be higher by about 0.6 μm than the upper surface of the main light blocking portion 222.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a first substrate and a second substrate facing each other;
a first thin film transistor disposed on the first substrate;
a second thin film transistor disposed on the first substrate;
a first color filter disposed on the first thin film transistor and a periphery of the first thin film transistor;
a second color filter disposed on the second thin film transistor and a periphery of the second thin film transistor and representing a different color from that of the first color filter; and
a light blocking member which is disposed on the first and second color filters, and includes:
a first spacer disposed on the first thin film transistor and the first color filter;
a second spacer disposed on the second thin film transistor and the second color filter; and
a main light blocking portion disposed in peripheries of the first and second spacers,
wherein the main light blocking portion includes a first portion, and a second portion which includes a furrow disposed at a boundary between the second spacer and the first portion of the main light blocking portion,
wherein a first thickness of the first spacer and the second spacer is greater than a second thickness of the first portion of the main light blocking portion, and a third thickness of the second portion of the main light blocking portion is less than the second thickness.

2. The display device of claim 1, wherein a height from an upper surface of the main light blocking portion to an upper surface of the first and second spacers is smaller than a distance from the upper surface of the main light blocking portion to a surface of the second substrate.

3. The display device of claim 2, wherein the furrow is disposed along an edge of the second spacer.

4. The display device of claim 3, wherein the furrow includes a closed curve.

5. The display device of claim 4, wherein the furrow has a width of about 1 micrometer to about 2 micrometers.

6. The display device of claim 5, wherein the furrow has a depth of about 0.1 micrometer to about 0.3 micrometer from the upper surface of the first portion of the main light blocking portion.

7. The display device of claim 3, wherein the second color filter disposed on the second thin film transistor has a greater thickness than that of the first color filter disposed on the first thin film transistor.

8. The display device of claim 7, wherein the light blocking member further includes a third spacer that is disposed on the periphery of the second thin film transistor and on the second color filter and is connected to the main light blocking portion, and a height from the upper surface of the main light blocking portion to an upper surface of the third spacer is smaller than a distance from the upper surface of the main light blocking portion to the surface of the second substrate.

9. The display device of claim 1, wherein a thickness of the second color filter disposed on the second thin film transistor is greater than that of the first color filter disposed on the first thin film transistor.

10. The display device of claim 1, wherein the second color filter represents green.

11. The display device of claim 1, further comprising a first pixel electrode disposed on the first color filter, and a second pixel electrode disposed on the second color filter.

* * * * *